United States Patent
Yang

(10) Patent No.: US 8,298,729 B2
(45) Date of Patent: Oct. 30, 2012

(54) MICROLITHOGRAPHY MASKS INCLUDING IMAGE REVERSAL ASSIST FEATURES, MICROLITHOGRAPHY SYSTEMS INCLUDING SUCH MASKS, AND METHODS OF FORMING SUCH MASKS

(75) Inventor: Ming-Chuan Yang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 201 days.

(21) Appl. No.: 12/726,925

(22) Filed: Mar. 18, 2010

(65) Prior Publication Data

US 2011/0229804 A1    Sep. 22, 2011

(51) Int. Cl.
G03F 1/36 (2012.01)
G03C 5/00 (2006.01)

(52) U.S. Cl. ............................................ 430/5; 430/311
(58) Field of Classification Search ................ 430/5, 30, 430/311, 394; 716/50–56
See application file for complete search history.

(56) References Cited

U.S. PATENT DOCUMENTS

| | | | |
|---|---|---|---|
| 5,928,813 | A | 7/1999 | Krivokapic et al. |
| 6,569,574 | B2 | 5/2003 | Baggenstoss |
| 6,692,876 | B2 | 2/2004 | Baggenstoss |
| 6,692,900 | B2 | 2/2004 | Baggenstoss |
| 6,749,969 | B2 | 6/2004 | Horak et al. |
| 6,803,155 | B2 | 10/2004 | Dulman et al. |
| 7,008,738 | B2 | 3/2006 | Dulman et al. |
| 7,122,453 | B2 | 10/2006 | Baggenstoss |
| 7,465,522 | B2 | 12/2008 | Bauch et al. |
| 7,648,803 | B2 | 1/2010 | Sivakumar et al. |
| 2006/0190919 | A1* | 8/2006 | Zhang et al. .................... 716/21 |
| 2008/0278700 | A1 | 11/2008 | Eppich et al. |
| 2009/0029272 | A1 | 1/2009 | O'Brien et al. |
| 2009/0053624 | A1 | 2/2009 | O'Brien et al. |
| 2009/0233183 | A1* | 9/2009 | Moon ............................... 430/5 |
| 2010/0040962 | A1 | 2/2010 | Rolfson |

OTHER PUBLICATIONS

Baba et al, Loss Reduction of an Arrow Waveguide in Shorter Wavelength and Its Stack Configuration, Journal of Lightwave Technology, vol. 6, No. 9, Sep. 1988, pp. 1440-1445.

Crouse et al, Experimental Demonstration of Dark Field Illumination Using Contact Hole Features, J. Vac. Sci. Technol. vol. B 25, No. 6, Nov./Dec. 2007, pp. 2453-2460.

Kawashima et al., Mask Optimization for Arbitrary Patterns with 2D-TCC Resolution Enhancement Technique, Proceedings of SPIE, vol. 6924 (2008), pp. 69240F-1-69240F-12.

Mansfield et al Lithographic Comparison of Assist Feature Design Strategies, Proceedings of SPIE, vol. 4000 (2000), pp. 63-76.

Morichetti et al., Box-Shaped Dielectric Waveguides: A New Concept in Integrated Optics?, Journal of Lightwave Technology, vol. 25, No. 9, Sep. 2007, pp. 2579-2589.

Painter et al., Improvements in Model-Based Assist Feature Placement Algorithms, Synopsis, Inc., 12 pages, (2006).

(Continued)

*Primary Examiner* — Stephen Rosasco
(74) *Attorney, Agent, or Firm* — TraskBritt

(57) ABSTRACT

Microlithography masks are disclosed, such as those that include one or more image reversal assist features disposed between at least two primary mask features. The one or more image reversal assist features may be defined by a patterned relatively non-transparent material on a mask substrate. Microlithography systems include such masks. Methods of forming microlithography masks are also disclosed, such as those that include patterning a relatively non-transparent material on a mask substrate to form at least one image reversal assist feature located between at least two primary features.

27 Claims, 8 Drawing Sheets

OTHER PUBLICATIONS

Petersen, Analytical Description of Anti-Scattering and Scattering Bar Assist Features, Proceedings of SPIE, vol. 4000 (2000), pp. 77-89, (2000).

Poonawala et al., Double-Exposure Mask Synthesis Using Inverse Lithography, J. Micro/Nanolith. MEMS MOEMS, vol. 6, No. 4, Oct.-Dec. 2007, pp. 043001-1-043001-9.

Shi et al., Understanding the Forbidden Pitch Phenomenon and Assist Feature Placement, Proceedings of SPIE, vol. 4689 (2002), pp. 985-996.

Smith, Mutually Optimizing Resolution Enhancement Techniques: Illumination, APSM, Assist Feature OPC, and Gray Bars, Rochester Institute of Technology, Microelectronic Engineering Department, Rochester, NY, 15 pages, (2001).

Word et al., Lithographic Tradeoffs Between Different Assist Feature OPC Design Strategies, Proceedings of SPIE, vol. 5042 (2003), pp. 293-304.

Word et al., Model-Based Prediction of Full-Chip SRAF Printability, Mentor Graphics, Design to Silicon, Technical Publication, 7 pages, (2004).

Yang, Analytical Optimization of High-Transmission Attenuated phase-Shifting Reticles, J. MicrolNanolith. MEMS MOEMS, vol. 8, No. 1, Jan.-Mar. 2009, pp. 013015-1-013015-7.

Yu et al., Invers-Lithography Approach Inspired by Wave Propagation, SPIE, 2009, 3 pages.

\* cited by examiner

Intensity on Workpiece

Electric Field On Workpiece

Phase of Electric Field on Workpiece

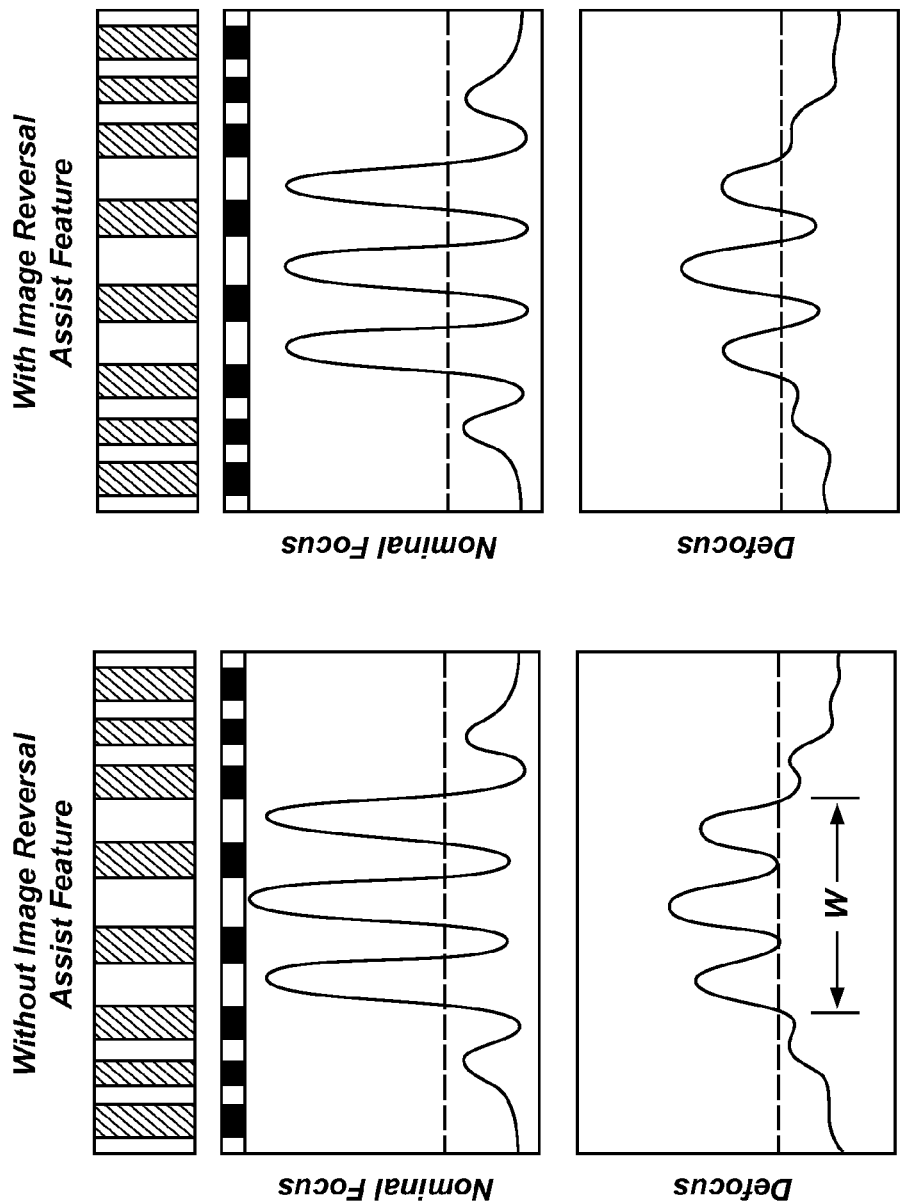

MICROLITHOGRAPHY MASKS INCLUDING IMAGE REVERSAL ASSIST FEATURES, MICROLITHOGRAPHY SYSTEMS INCLUDING SUCH MASKS, AND METHODS OF FORMING SUCH MASKS

TECHNICAL FIELD

Embodiments of the present invention generally relate to microlithography masks and systems, and to methods of forming such masks. More particularly, embodiments of the present invention generally relate to the use of assist features in microlithography masks and systems for improving the definition of primary features formed using such microlithography masks and systems.

BACKGROUND

The incorporation of increasing numbers of discrete devices (e.g., transistors, conductive lines, conductive contact pads, etc.) into progressively smaller integrated circuits remains an important challenge in the manufacture of semiconductor devices, such as memory devices and electronic signal processors.

Many such discrete devices are fabricated using microlithography. Briefly, and in general terms, in photolithographic processes, a photolithographic mask, which is often referred to in the art as a "mask," is formed that includes a desired pattern corresponding to a particular pattern that is to be transferred (e.g., "printed") to a layer of material on a semiconductor die or wafer. The pattern generally includes optically transparent areas and optically opaque areas that are suitably arranged on an optically transparent supporting substrate. The mask may then be interposed between an illumination system and a layer of an illumination-sensitive photoresist material applied to a semiconductor wafer. The illumination system emits illumination radiation through the mask and onto the photoresist material. The mask allows certain regions of the photoresist material to be exposed to the illumination radiation while shielding other regions of the photoresist material from the illumination radiation, in accordance with the pattern of the mask. The exposure of certain regions of photoresist material to the illumination radiation results in changes to the properties of the photoresist material in those exposed regions. The photoresist material is then "developed," which results in removal of either the regions exposed to the illumination radiation or the regions that were shielded from the illumination radiation. As a result, the photoresist material is provided with a pattern corresponding to that of the mask. The semiconductor die or wafer, with the patterned photoresist material then may be further processed in any number of ways to further fabricate discrete devices on or in the die or wafer.

The illumination radiation may be monochromatic. When a wavelength of the illumination radiation is greater than a minimum feature size of a pattern to be transferred to a photoresist material using a mask, various optical effects may adversely affect the quality of the resulting features formed on or in the die or wafer using the patterned photoresist material. For example, edges between transparent areas and opaque areas on a mask may contribute to diffraction of the illumination radiation, which may result in interference of the waves of illumination radiation after passing through the mask, resulting in exposure reduction in areas intended to be exposed, and exposure in areas intended to be shielded from exposure. As feature sizes in semiconductor structures decrease, diffractive effects, as well as other optical effects become more prominent limiting factors in microlithography.

Accordingly, various compensation methods are available that may increase the pattern fidelity in the structure. For example, in one known method, optical proximity correction (OPC) may be used to perturb the shapes of transmitting apertures, or other features on the mask to enhance optical resolution in the sub-wavelength regime. In general, the perturbed features on the mask are sub-resolution features since they are generally not printed onto the structure during the exposure process. Accordingly, such features are often referred to as sub-resolution assist features. Examples of sub-resolution assist features include "serifs" for reducing corner rounding in features formed in the structure, and "hammerheads" for reducing the shortening of end line features. Other sub-resolution assist features include scattering bars, or "outriggers," and "inriggers" that improve line width control in the structure. Still other methods may be used to improve the resolution of features in the sub-resolution regime. For example, Phase Shift Masking (PSM) methods generally enable transparent areas on the mask to transmit phase-shifted illumination to the structure in order to reduce destructive interference that may occur between transparent areas that are separated by an opaque area on the mask. Still other methods may be directed to the illumination system itself. For example, an incident radiation angle ($\sigma$) and/or the numerical aperture (NA) of a projection lens may be suitably configured to resolve relatively dense lines and spaces.

BRIEF DESCRIPTION OF THE SEVERAL VIEWS OF THE DRAWINGS

FIG. 4A illustrates intensity levels of electromagnetic radiation that may be present on a semiconductor structure being processed in a microlithography process using a mask similar to that of FIGS. 3A and 3B, but without any image reversal assist features, at nominal focus conditions and at defocused conditions.

FIG. 4B illustrates intensity levels of electromagnetic radiation that may be present on a semiconductor structure being processed in a microlithography process using the mask of FIGS. 3A and 3B, which includes image reversal assist features, at nominal focus conditions and at defocused conditions.

DETAILED DESCRIPTION

Figure 1:
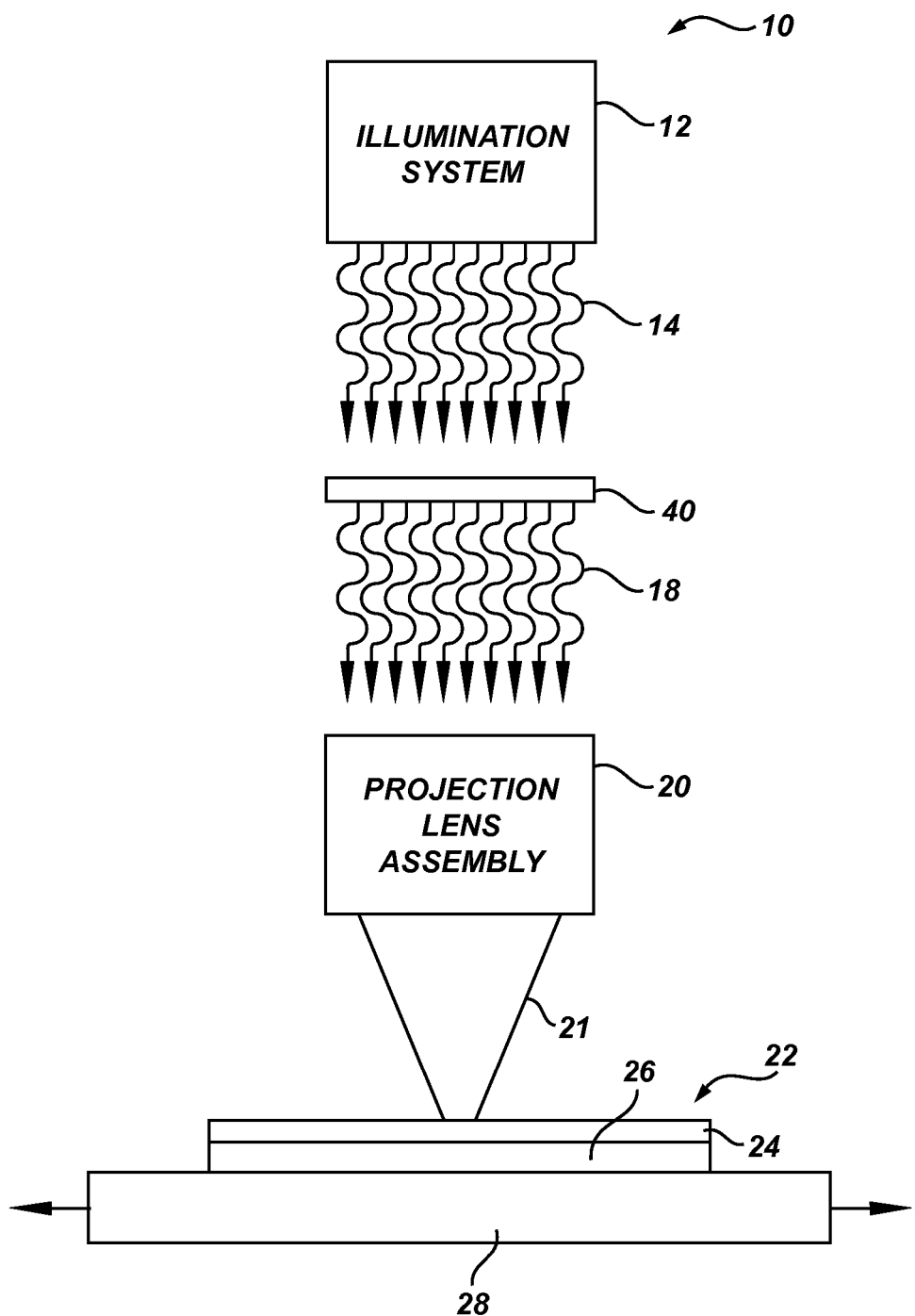
FIG. 1 is a schematic diagram illustrating an embodiment of a microlithography system of the invention.

The illustrations presented herein are not meant to be actual views of any particular semiconductor device, transistor, or system, but are merely idealized representations that are employed to describe the present invention. Additionally, elements common between figures may retain the same numerical designation.

As used herein, the term "microlithography" means a process in which one or more material properties of selected regions of a material are altered by exposing the selected regions of the material to electromagnetic radiation without exposing other regions of the material to the electromagnetic radiation.

As used herein, the term "mask" means a patterned mask for use in a microlithography process, through which electromagnetic radiation is passed to expose selected regions of a material to the electromagnetic radiation and to shield other selected regions of the material from the electromagnetic radiation. Masks are often referred to in the art as "reticles," and, as used herein, the term "mask" means and includes what are referred to in the art as reticles.

As used herein, the term "feature," when used with respect to a feature of a mask, means a finite area of the mask that is configured to allow electromagnetic radiation to pass through the feature and onto a semiconductor structure to be processed using the mask, to shield the semiconductor structure to be processed using the mask from the electromagnetic radiation, or to shift a phase of, and/or attenuate, electromagnetic radiation passing through the mask and onto the semiconductor structure to be processed using the mask. As one example, a mask may comprise a relatively non-transparent material, such as a semi-transparent or non-transparent material (e.g., opaque), wherein the term "relatively" means relative to a substantially transparent material (e.g., substrate) over which the relatively transparent material is formed, and the features of such a mask might include apertures (e.g., holes) formed through a layer of relatively non-transparent material over the substantially transparent substrate. As another example, features of such a mask may comprise finite two-dimensional areas of the relatively non-transparent material over the transparent substrate.

As used herein, the term "primary feature," when used with respect to a feature of a mask, means a feature that corresponds to and has a shape like that of a feature to be patterned (e.g., resolved) on a semiconductor structure to be processed using the mask in a microlithography process.

As used herein, the term "light feature," when used with respect to a feature of a mask, means a feature comprising a substantially optically transparent area of the mask.

As used herein, the term "dark feature," when used with respect to a feature of a mask, means a feature comprising a relatively non-transparent area of the mask.

As used herein, the term "assist feature," when used with respect to a feature of a mask, means a feature such as one that has a size or shape too small to be patterned (e.g., resolved) on a semiconductor structure to be processed using the mask in a microlithography process, but that has a size, shape, and/or location configured to improve the contrast and/or definition of primary features to be patterned on the semiconductor structure to be processed using the mask in a microlithography process.

As used herein, the term "standard assist feature" means an assist feature that has a size, shape, and/or location configured such that electromagnetic radiation passing through the assist feature will either resonate or anti-resonate with electromagnetic radiation passing through primary features of the mask.

As used herein, the term "image reversal assist feature" means an assist feature that is not a standard assist feature, such that electromagnetic radiation passing through the image reversal assist feature will not resonate or anti-resonate with electromagnetic radiation passing through primary features of the mask.

FIG. 1 is a diagrammatic block view of an embodiment of a microlithography system 10 of the invention. The system 10 includes an illumination system 12 that is configured to emit illumination electromagnetic radiation 14 that may be used for microlithography. Accordingly, the system 10 may include illumination sources that are operable to generate radiation 14 in the deep ultraviolet (DUV) portion of the spectrum, such as an excimer laser. Suitable excimer laser sources may include a xenon-fluoride (XeF) device that emits radiation at a wavelength of 351 nanometers (nm), a xenon-chloride (XeCl) device that emits radiation at a wavelength of 308 nm, a krypton-fluoride (KrF) device that emits radiation at a wavelength of 248 nanometers (nm), and an argon-fluoride (ArF) that emits radiation at a 193 nm wavelength. Other wavelengths also may be used.

The illumination system 12 may also include devices that provide off-axis illumination corresponding to a selected illumination mode. For example, suitable devices may be configured to generate a dipole-type illumination mode, an annular illumination mode, a two pole illumination mode, a four pole illumination mode, or another illumination mode. The illumination system 12 may also include other optical devices that are operable to produce illumination radiation 14 having a desired intensity and/or distribution.

The illumination system 12 may be suitably positioned relative to an imaging mask 40 (FIGS. 2A and 2B), so that the illumination radiation 14 emitted from the system 12 is projected onto and through the imaging mask 40. The imaging electromagnetic illumination 18 corresponds to the radiation 14 that is selectively transmitted through the imaging mask 40.

Although the mask 40 is described in further detail below with reference to FIGS. 2A and 2B, the imaging mask 40 may include a substrate comprising a material that is substantially transparent to the illumination radiation 14, and a material over a surface of the substrate that is relatively non-transparent material (e.g., opaque) to the illumination radiation 14. The substrate may comprise a material such as, for example, fused quartz, soda-lime glass, borosilicate glass, or borophosphosilicate glass. The relatively non-transparent material may comprise, for example, at least one of a metal (e.g., chromium), a metal alloy (e.g., a chromium-based alloy), and a material comprising molybdenum and/or silicon (e.g., molybdenum silicide). The relatively non-transparent material also may comprise oxygen and nitrogen atoms as well. In some embodiments, relatively non-transparent materials may be used to provide phase shifting areas on the mask 40 for shifting a phase of the illumination radiation 14 as it passes through the mask 40 and becomes the imaging radiation 18.

With continued reference to FIG. 1, the microlithography system 10 may further include a projection lens assembly 20 that is configured to project the imaging illumination onto a workpiece. For example, the projection lens assembly might be configured to collect the imaging illumination 18 and form focused imaging electromagnetic radiation 21 therefrom. The focused imaging radiation 21 may then be directed onto a workpiece 22 being processed to form a semiconductor device. By way of example and not limitation, the projection lens assembly 20 may be configured to focus the imaging radiation 21 such that the patterned image at the surface of the workpiece 22 is about one-fourth the size of the mask 40. In other words, the mask 40 may be about four times as large as the resulting image formed on the surface of the workpiece 22. Thus, features on the mask 40 may have dimensions that are about four times as large as the features to be patterned at the surface of the workpiece 22.

The workpiece 22 may comprise a photoresist material 24 that is disposed over a semiconductor structure 26 (e.g., a die or wafer). The photoresist material 24 is responsive to the imaging radiation 21. Since the photoresist 24 may be repetitively exposed to the focused imaging radiation 21 to form separately exposed areas on the semiconductor structure 26, the workpiece 22 may be positioned upon a stage 28 that may be translated in one or more of several (e.g., two or three) mutually orthogonal directions.

In some embodiments of the invention, the mask 40 may comprise an attenuated phase-shifting mask. For an improved understanding of such embodiments, FIGS. 2A through 2C are used to illustrate how an attenuated phase shifting mask may be used to provide patterned intensity levels of electromagnetic radiation on a semiconductor structure to be processed using an attenuated phase shifting mask in a microlithography process.

Figure 2A:
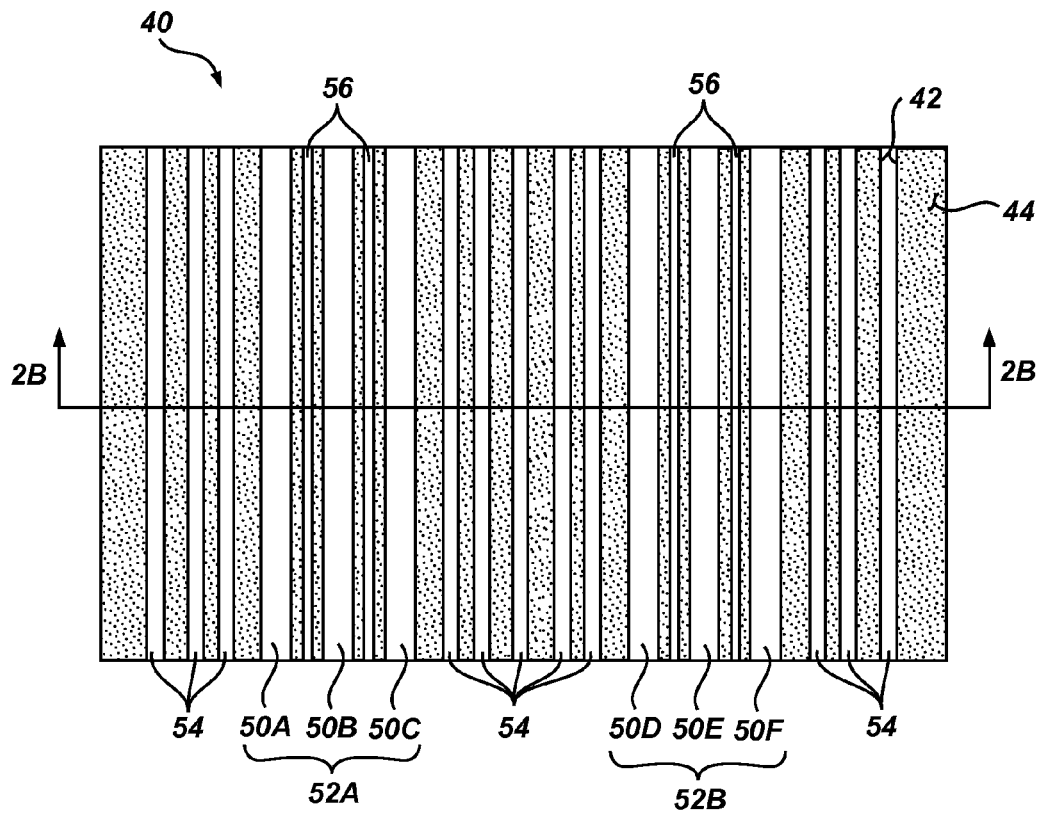
FIG. 2A is a simplified plan-view of a portion of an embodiment of a microlithography mask of the invention that includes image reversal assist features.
Figure 2B:
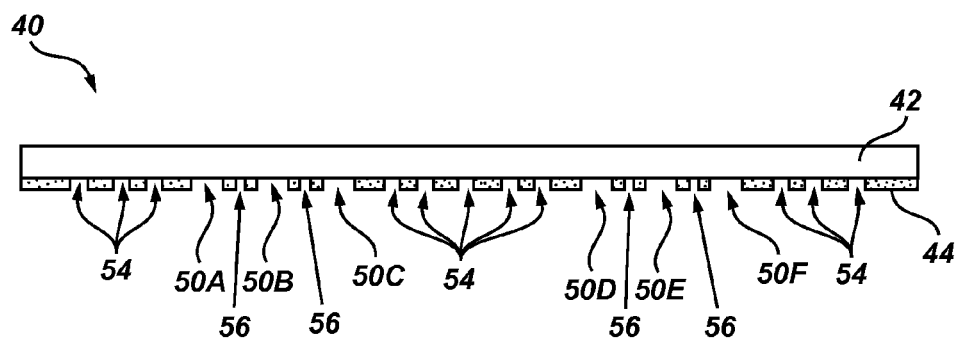
FIG. 2B is a cross-sectional view of the microlithography mask of FIG. 2A taken along section line 2B-2B shown therein.

FIGS. 2A and 2B illustrate a portion of an embodiment of a microlithography mask 40 of the invention. FIG. 2A is a partial plan view of the illustrated portion of the mask 40, and FIG. 2B is a cross-sectional view of the portion of the mask 40 taken along section line 2B-2B shown in FIG. 2A. As shown in FIG. 2A, the mask 40 includes a substantially transparent substrate 42 and relatively non-transparent material 44 on selected areas of the substrate 42, thus defining a plurality of light features (illustrated as clear areas in FIG. 2A) and dark features (illustrated as stippled areas in FIG. 2A) on the mask 40. In some embodiments, the mask 40 may comprise an attenuated phase shifting mask, wherein the relatively non-transparent material 44 is an absorbing π (pi or 180°) phase shifting material. Such masks may be referred to in the art as "transmission-pi" or "t-pi" masks. By way of example and not limitation, the transmission of the relatively non-transparent material 44 may be about 10% or less. In such embodiments, the dark features are configured (e.g., sized and composed) to attenuate and shift a phase of electromagnetic radiation passing through the relatively non-transparent material 44 of the dark features of the mask 40.

The portion of the mask 40 shown in FIGS. 2A and 2B is configured to pattern (e.g., resolve) two sets of three lines on a workpiece 22 when the mask 40 is used in a microlithography process. In particular, the portion of the mask 40 includes primary line features 50A through 50F, each of which includes a line. Thus, the portion of the mask 40 shown in FIGS. 2A and 2B is configured to pattern portions of six lines in a photoresist material 24 on a workpiece 22 being processed using the mask 40.

The lines of primary features 50A through 50C are disposed in a first group 52A, and the lines of primary features 50D through 50F are disposed in a second group 52B, as shown in FIG. 2A. The primary features in each group 52A, 52B may be densely packed relative to one another at a pitch close to the critical dimension (CD) of the microlithography process. The spacing between the groups 52A, 52B may be somewhat greater than the critical dimension of the microlithography process. Thus, the primary features 50D through 50F may comprise what are referred to in the art as semi-isolated features, such as those commonly found in the laterally peripheral areas of the integrated circuits of semiconductor devices (e.g., memory devices and logic devices).

The mask 40 also includes various assist features that are configured to improve the contrast of the patterned image and/or the definition of the six lines to be patterned in a photoresist material 24 on a workpiece 22 by the primary features 50A through 50F.

The mask 40 includes a plurality of standard assist features 54, each of which may be located at resonant or anti-resonant locations relative to the primary features 50A through 50F. In particular, the standard assist features 54 may be located to the lateral sides of each of the groups 52A, 52B of primary features 50A through 50F, as shown in FIGS. 2A and 2B. The standard assist features 54 may comprise light features, each of which includes a line having a shape and configuration similar to that of a line of the primary features 50A through 50F, but having a smaller width that is below the resolution limit. The standard assist features 54 may serve as light field assist features, in that they may serve to increase exposure to imaging radiation in the regions of photoresist material 24 corresponding to the primary features to be patterned in the photoresist material 24 on a workpiece 22 being processed using the mask 40. Thus, the standard assist features 54 may assist in improving the definition of the primary features to be patterned in a photoresist material 24 on a workpiece 22 being processed using the mask 40, but may not themselves be used to directly pattern a photoresist material 24 on a workpiece 22 being processed using the mask 40.

The primary features 50A through 50F in each of the groups 52A, 52B may themselves be densely packed, such that there is no resonant or anti-resonant position between any of the primary features 50A through 50F within any one of the groups 52A, 52B, such that a standard assist feature could be placed therebetween.

As shown in FIGS. 2A and 2B, the mask 40 also includes a plurality of image reversal assist features 56, each of which may be located other than at a resonant or anti-resonant location relative to the primary features 50A through 50F. In particular, the image reversal assist features 56 may be located between the primary features 50A through 50F within each of the groups 52A, 52B of primary features 50A through 50F, as shown in FIGS. 2A and 2B. The image reversal assist features 56, like the standard assist features 54, also may comprise light features, each of which includes a line having a shape and configuration similar to that of a line of the primary features 50A through 50F, but having a smaller width that is below the resolution limit. Due at least partially to their location, however, the image reversal assist features 56 may serve as dark field assist features, instead of as light field assist features. In other words, the image reversal assist features 56 may serve to decrease undesirable exposure to imaging radiation in the regions of photoresist material 24 between those corresponding to the primary features to be patterned in the photoresist material 24 on a workpiece 22 being processed using the mask 40. Thus, in this manner, the image reversal assist features 56 further assist in improving the definition of the primary features to be patterned in a photoresist material 24 on a workpiece 22 being processed using the mask 40, but may not themselves be used to directly pattern a photoresist material 24 on a workpiece 22 being processed using the mask 40.

Figure 3A:
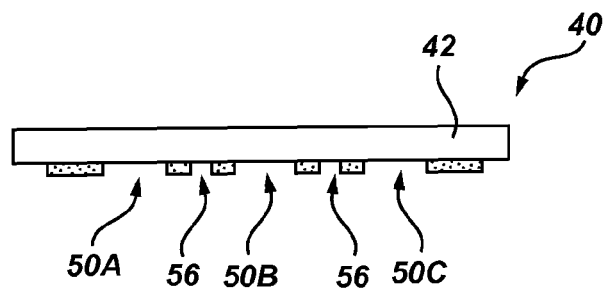
FIG. 3A is an enlarged view of a portion of FIG. 2B.
Figure 3B:
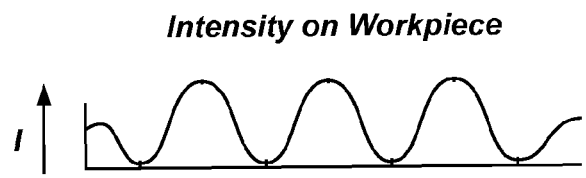
FIG. 3B is a graph illustrating an intensity of electromagnetic radiation that may be present on the semiconductor structure being processed in such a microlithography process using the portion of the mask shown in FIG. 3A.
Figure 3C:
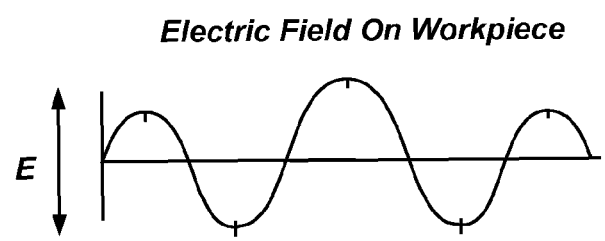
FIG. 3C is a graph illustrating an electric field that may be present at the semiconductor structure being processed in such a microlithography process using the portion of the mask shown in FIG. 3A during a microlithography process.
Figure 3D:
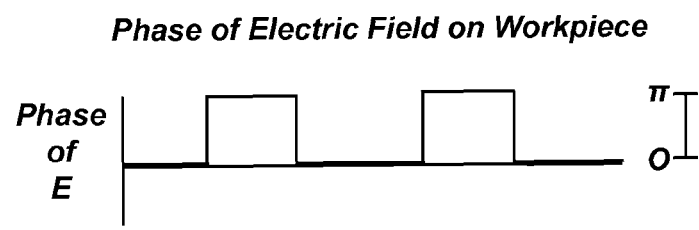
FIG. 3D is a plot of the phase of the electric field of FIG. 3C that may be present at the semiconductor structure being processed in such a microlithography process using the portion of the mask shown in FIG. 3A during a microlithography process.

FIGS. 3A through 3D are used to illustrate how image reversal assist features 56 may be positioned on a mask 40. FIG. 3A is an enlarged view of a portion of FIG. 2B that includes the primary features 50A through 50C and the image reversal assist features 56 therebetween. FIGS. 3B through 3D are graphs that are vertically aligned with the mask 40 to illustrate the effect the various regions of the illustrated portion of the mask 40 have on the resulting imaging electromagnetic radiation ultimately impinging on a workpiece, like the workpiece 22 of FIG. 1.

FIG. 3B is a graph illustrating an intensity of electromagnetic radiation that may be present at a surface of a workpiece 22 being processed in a microlithography process using the portion of the mask 40 of FIG. 3A. As shown in FIG. 3B, the intensity plot is sinusoidal in shape and varies between a maximum intensity and a minimum intensity, with peaks corresponding to the centers of the primary features 50A through 50C of the mask 40. The intensity of radiation at a surface of a workpiece 22 being processed in a microlithography process is proportional to the square of the electric field present at the surface of the workpiece 22. As a result, the intensity is always positive.

FIG. 3C is a graph illustrating an electric field that may be present at a surface of a workpiece 22 being processed in a microlithography process using the portion of the mask 40 of FIG. 3A. As shown in FIG. 3C, the electric field plot is also sinusoidal in shape and varies between maximum positive (e.g., "0") phase value and maximum negative (e.g., "π") phase value (which correspond to the minimum/lowest points in the graph). The alternating peaks and valleys of the plot of the electric field shown in FIG. 3C correspond to the peaks of the plot of the radiation intensity shown in FIG. 3B, and, hence, to the centers of the primary features 50A through 50C of the mask 40.

FIG. 3D is a plot of the phase of the electrical field shown in FIG. 3C that may be present at a surface of a workpiece 22 being processed in a microlithography process using the portion of the mask 40 of FIG. 3A. As shown in FIG. 3D, the transitions between the positive phase regions and the negative phase regions are immediate, step-wise transitions.

As will be appreciated upon comparison of FIGS. 3A, 3C, and 3D, the image reversal assist features 56 may be provided at, or at least proximate, locations on the mask 40 between the primary features 50A through 50F that correspond to the locations at which the phase of the electrical field present at the surface of the workpiece 22 being processed using the mask 40 transitions between the "0" phase values and the "π" phase values. As the primary features 50A through 50F are densely packed features, there are no locations between any two of the primary features 50A through 50F that correspond to resonant or anti-resonant locations with the primary features 50A through 50F. Thus, there is no space for standard assist features 54 between any two of the primary features 50A through 50F.

Referring again to FIGS. 2A and 2B, as one non-limiting embodiment set forth merely as an example, each of the primary features 50A through 50F may have an average width of about three hundred and eight nanometers (308 nm) on the mask 40, such that the primary features to be patterned in the photoresist material 24 at a surface of a workpiece 22 have an average width of about seventy-seven nanometers (77 nm), which is one-fourth of the width of the primary features 50A through 50F on the mask 40. The pitch of the primary features 50A through 50F on the mask 40 also may be about three hundred and eight nanometers (308 nm), such that the center of one of the primary features 50A through 50F is separated from the center of the next immediately adjacent primary features 50A through 50F by about three hundred and eight nanometers (308 nm). The minimum feature size (i.e., the critical dimension) in such an embodiment may be about fifty-seven nanometers (57 nm). Each of the image reversal assist features 56 may have an average width of eighty nanometers (80 nm) on the mask 40, such that, after reduction by the projection lens assembly, the lines in the image applied to the photoresist material 24 at the surface of the workpiece 22 have an average width of about twenty nanometers (20 nm), which is below the minimum feature size, and, thus, will not be patterned in the photoresist material 24.

In additional embodiments, each of the primary features 50A through 50F may have an average width of less than about four hundred nanometers (400 nm) on the mask 40, less than about three hundred nanometers (300 nm) on the mask 40, less than about two hundred nanometers (200 nm) on the mask 40, or even than about one hundred nanometers (100 nm) on the mask 40. In some embodiments, the distance between the primary features 50A through 50F in each respective group 52A, 52B thereof may be between about 90% and about 110% of the average width of the primary features 50A through 50F. In additions embodiments, the distance between the primary features 50A through 50F in each respective group 52A, 52B thereof may be up to about 150% of the average width of the primary features 50A through 50F. Furthermore, in some embodiments, the image reversal assist features 56 may have an average width that is between about 10% and about 70% (e.g., about 25%) of the average width of the primary features 50A through 50F, and that is below the critical dimension of the microlithography process in which the mask 40 is to be employed.

As known in the art, the ability to clearly pattern an image in a photoresist material 24 using a microlithography system 10 like that of FIG. 1 is limited by the wavelength of the electromagnetic radiation employed in the system 10 and the ability of the mask 40 and the projection lens assembly 20 to capture diffraction orders of the radiation and focus the radiation onto the workpiece 22. The minimum feature size that a microlithography system 10 can pattern may be approximated using Equation 1 below:

$$CD = k_1 (\lambda / NA) \qquad \text{Equation 1}$$

wherein CD is the critical dimension (i.e., the minimum feature size that can be patterned), $k_1$ is a coefficient that encapsulates process related factors, and NA is the numerical aperture of the projection lens assembly as seen by the workpiece 22. Thus, in order to reduce the critical dimension, "low $k_1$" processes are required (e.g., processes having a $k_1$ value of about 0.30 or less). In low k1 microlithography processes, however, the illumination radiation is often optimized toward the critical, densely packed features of the semiconductor device being fabricated, which may leave the peripheral isolated and/or semi-isolated features un-optimized. Thus, a sufficient depth of focus should be maintained to ensure that all features to be patterned, including densely packed central features, as well as isolated and semi-isolated peripheral features. By employing image reversal assist features 56 in masks 40 used in low $k_1$ microlithography processes as described herein, the depth of focus may be improved relative to processes in which similar masks not including such image reversal assist features 56 are employed.

FIGS. 4A and 4B are used to illustrate how use of masks having image reversal assist features 56 may improve the depth of focus relative to processes in which similar masks not including such image reversal assist features 56 are employed.

FIG. 4A illustrates the results of computer simulations conducted using a computer model of a portion of a mask similar to the mask 40 of FIGS. 2A and 2B and including a group 52A of three primary features 50A through 50C and standard assist features 54 to the lateral sides of the group 52A, but that does not include image reversal assist feature 56 between the primary features 50A through 50C in the group 52A. The computer simulations were conducted using Technology Computer Aided Design (TCAD) Sentaurus Lithography (S-Litho) software, which is commercially available from Synopsys, Inc. of Mountain View, Calif. FIG. 4A includes two graphs, one of which illustrates the calculated intensity of the electromagnetic radiation that would be present at a surface of a workpiece 22 being processed in a microlithography process using the portion of the mask of FIG. 4A (which does not include image reversal assist features 56) at nominal focus conditions, the other of which illustrates the calculated intensity of the electromagnetic radiation that would be present at a surface of a workpiece 22 being processed in a microlithography process using the portion of the mask of FIG. 4A at defocused conditions. The horizontal dashed line in each of the graphs illustrates the intensity level at which the photoresist material 24 will become "exposed" to the radiation and undergo the physical and/or chemical changes associated with exposure. As shown in the graph of FIG. 4A corresponding to the defocus conditions, there is insufficient contrast between the intensity peaks corresponding to the primary features 50A through 50C to prevent exposure of the photoresist material 24 between the peaks. Thus, a single line having a relatively larger width W would likely be patterned in the photoresist material 24 under such defocus conditions.

FIG. 4B illustrates the results of computer simulations conducted using a computer model of a portion of the mask 40 of FIGS. 2A and 2B including the group 52A of three primary features 50A through 50C, the standard assist features 54 to the lateral sides of the group 52A, and the image reversal assist features 56 between the primary features 50A through 50C in the group 52A. FIG. 4B also includes two graphs, one of which illustrates the calculated intensity of the electromagnetic radiation that would be present at a surface of a workpiece 22 being processed in a microlithography process using the illustrated portion of the mask 40 shown in FIG. 4B (which does include image reversal assist features 56) at nominal focus conditions, and the other of which illustrates the calculated intensity of the electromagnetic radiation that would be present at a surface of a workpiece 22 being processed in a microlithography process using the portion of the mask 40 at the same defocus conditions used in the defocus simulations associated with FIG. 4A. Again, the horizontal dashed line in each of the graphs illustrates the intensity level at which the photoresist material 24 will become "exposed" to the radiation and undergo the physical and/or chemical changes associated with exposure. As shown in the graph of FIG. 4B corresponding to the defocus conditions, there is sufficient contrast between the intensity peaks corresponding to the primary features 50A through 50C at the same defocus conditions associated with the defocus conditions of FIG. 4A to prevent exposure of the photoresist material 24 between the peaks. Thus, three separate lines having relatively smaller widths would likely be patterned, as intended, in the photoresist material 24 under such defocus conditions.

Thus, by employing the image reversal assist features 56 in the mask 40, the depth of focus may be improved relative to processes in which similar masks not including such image reversal assist features 56 are employed.

Figure 5:
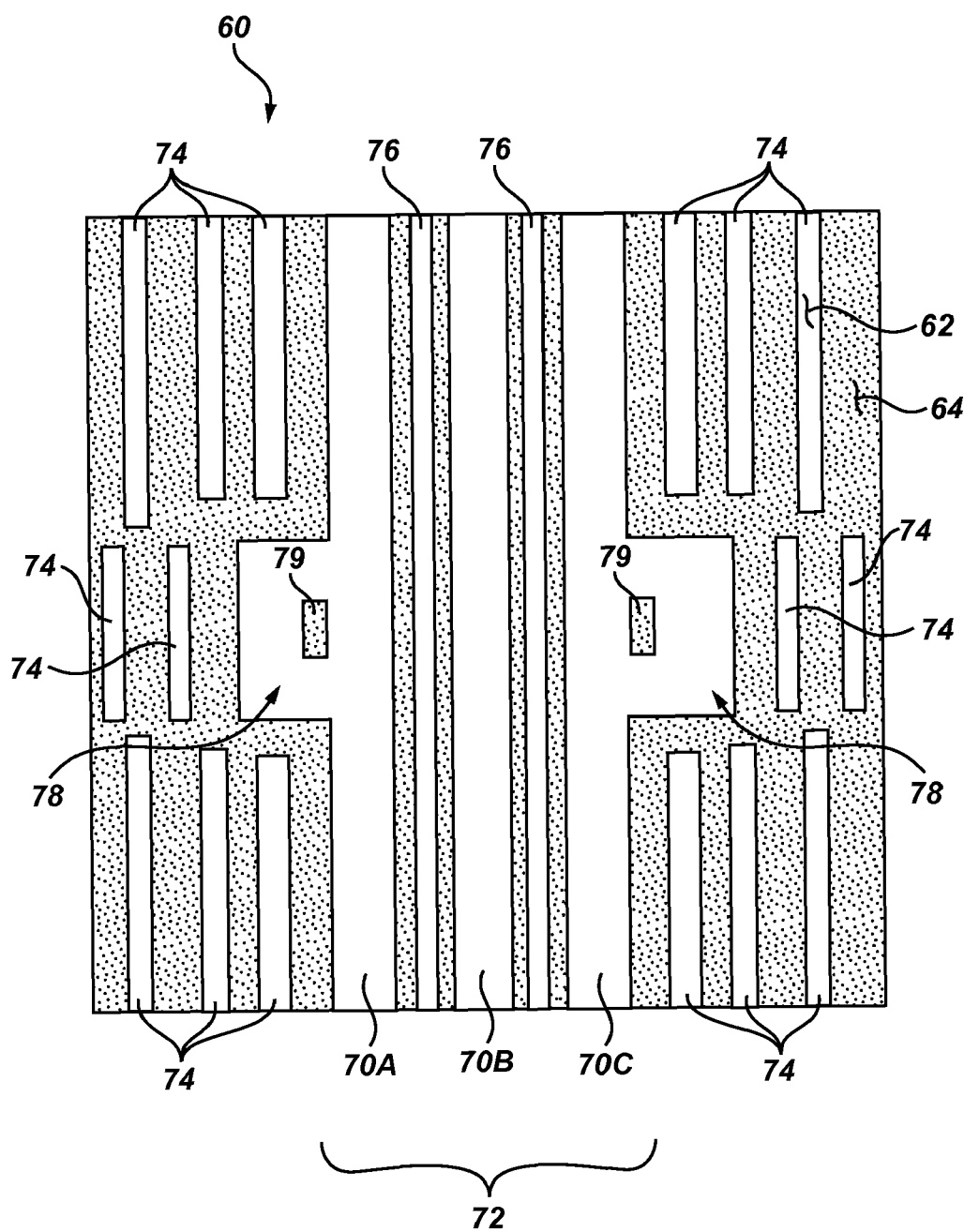
FIG. 5 is a simplified plan view illustration of a portion of another embodiment of a microlithography mask of the invention that includes image reversal assist features.

FIG. 5 is a simplified plan view illustration of a portion of another embodiment of a microlithography mask 60 of the invention that includes image reversal assist features 76. The mask 60 is generally similar to the mask 40 of FIGS. 2A and 2B and includes a substantially transparent substrate 62 and relatively non-transparent material 64 on selected areas of the substrate 62, thus defining a plurality of light features (illustrated as clear areas in FIG. 5) and dark features (illustrated as stippled areas in FIG. 5) on the mask 60. In some embodiments, the mask 60 may comprise an attenuated phase shifting mask, wherein the relatively non-transparent material 64 is an absorbing π (pi or 180°) phase shifting material. The portion of the mask 60 shown in FIG. 5 is configured to pattern (e.g., resolve) a set of three primary features on a workpiece 22 when the mask 60 is used in a microlithography process to process the workpiece 22. In particular, the portion of the mask 60 includes a group 72 of primary features 70A through 70C. The primary features 70A and 70C are line features, each of which includes an integral contact pad area 78 (which may or may not be symmetrical and of similar shape). The primary feature 70B is a line feature, similar to the primary features 50A-50F of FIGS. 2A and 2B, that does not include an integral contact pad area 78 (at least in the vicinity of the contact pad areas 78 of the primary features 70A and 70C). Thus, the portion of the mask 60 shown in FIG. 5 is configured to pattern portions of three lines, two of which also having an integrated contact pad area, in a photoresist material 24 on a workpiece 22 being processed using the mask 60.

The primary features 70A through 70C may comprise semi-isolated features, such as those commonly found in the laterally peripheral areas of the integrated circuits of semiconductor devices (e.g., memory devices and logic devices), as previously discussed in relation to FIGS. 2A and 2B.

The mask 60 also includes various assist features that are configured to improve the contrast of the patterned image and/or the definition of the primary features to be printed in a photoresist material 24 on a workpiece 22 by the primary features 70A through 70C.

The mask 60 includes a plurality of standard assist features 74, each of which may be located at resonant or anti-resonant locations relative to the primary features 70A through 70C. In particular, the standard assist features 74 may be located to the lateral sides of the group 72 of primary features 70A through 70C, as shown in FIG. 5. The standard assist features 74 may comprise light features having widths that are below the resolution limit for features on the mask 60. The standard assist features 74 may serve as light field assist features, in that they may serve to increase exposure to imaging radiation in the regions of photoresist material 24 corresponding to the primary features to be patterned in the photoresist material 24 on a workpiece 22 being processed using the mask 60. Thus, the standard assist features 74 may assist in improving the definition of the primary features to be patterned in a photoresist material 24 on a workpiece 22 being processed using the mask 60, but may not themselves be used to directly pattern a photoresist material 24 on a workpiece 22 being processed using the mask 60.

The mask 60 also includes dark standard features 79, which may be sized, shaped, and/or located to assist in the definition of contact area pads to be patterned primarily by the contact pad areas 78 of the mask 60. The dark standard features 79 may be sized, shaped, and located such that the light intensity in the contact pad areas 78 will be reduced while maintaining sufficient contrast to prevent the light at the contact pad areas 78 from being blurred significantly at defocus conditions in order to maintain the presence of photoresist material between the contact pad areas 78 and the primary feature 70B. While the dark standard features 79 themselves might unintentionally print at defocus conditions, the image reversal assist features 76 may alleviate this issue because, while the image reversal assist features 76 may reduce the light intensity at photoresist material between the contact pad areas 78 and the primary feature 70B, they also may expel light toward the lateral sides of the image reversal assist features 76 and into the contact pad areas 78, such that the standard dark features 79 are less likely to print. The increased light intensity at the contact pad areas 78 may result from the image reversal assist features 76 actually transmitting more light at the mask relative to the case (FIG. 6A) in which the image reversal assist features 76 are absent (FIG. 6A).

The primary features 70A through 70C in the group 72 may themselves be densely packed, such that there is no resonant or anti-resonant position between any of the primary features 70A through 70C within the group 72, such that a standard assist feature could be placed therebetween.

As shown in FIG. 5, the mask 60 also includes a plurality of image reversal assist features 76, each of which may be located other than at a resonant or anti-resonant location relative to the primary features 70A through 70C. In particular, the image reversal assist features 76 may be located between the primary features 70A through 70C, as shown in FIG. 5. The image reversal assist features 76, like the standard assist features 74, also may comprise light features, each of which includes a line having a shape and configuration similar to that of a line of the primary features 70A through 70C, but having a smaller width that is below the resolution limit of features on the mask 60. The image reversal assist features 76 may not have any feature corresponding to the contact pad areas 78 of the primary features 70A through 70C, other than the area of the contact pad areas 78 provided by the lines of the primary features 70A through 70C. Due at least partially to their location, however, the image reversal assist features 76 may serve as dark field assist features, instead of as light field assist features, as do the standard assist features 74. In other words, the image reversal assist features 76 may serve to decrease undesirable exposure to imaging radiation in the regions of photoresist material 24 between those corresponding to the primary features to be patterned in the photoresist material 24 on a workpiece 22 being processed using the mask 60. Thus, in this manner, the image reversal assist features 76 further assist in improving the definition of the primary features to be patterned in a photoresist material 24 on a workpiece 22 being processed using the mask 60, but may not themselves be used to directly pattern in a photoresist material 24 on a workpiece 22 being processed using the mask 60.

Figure 6:
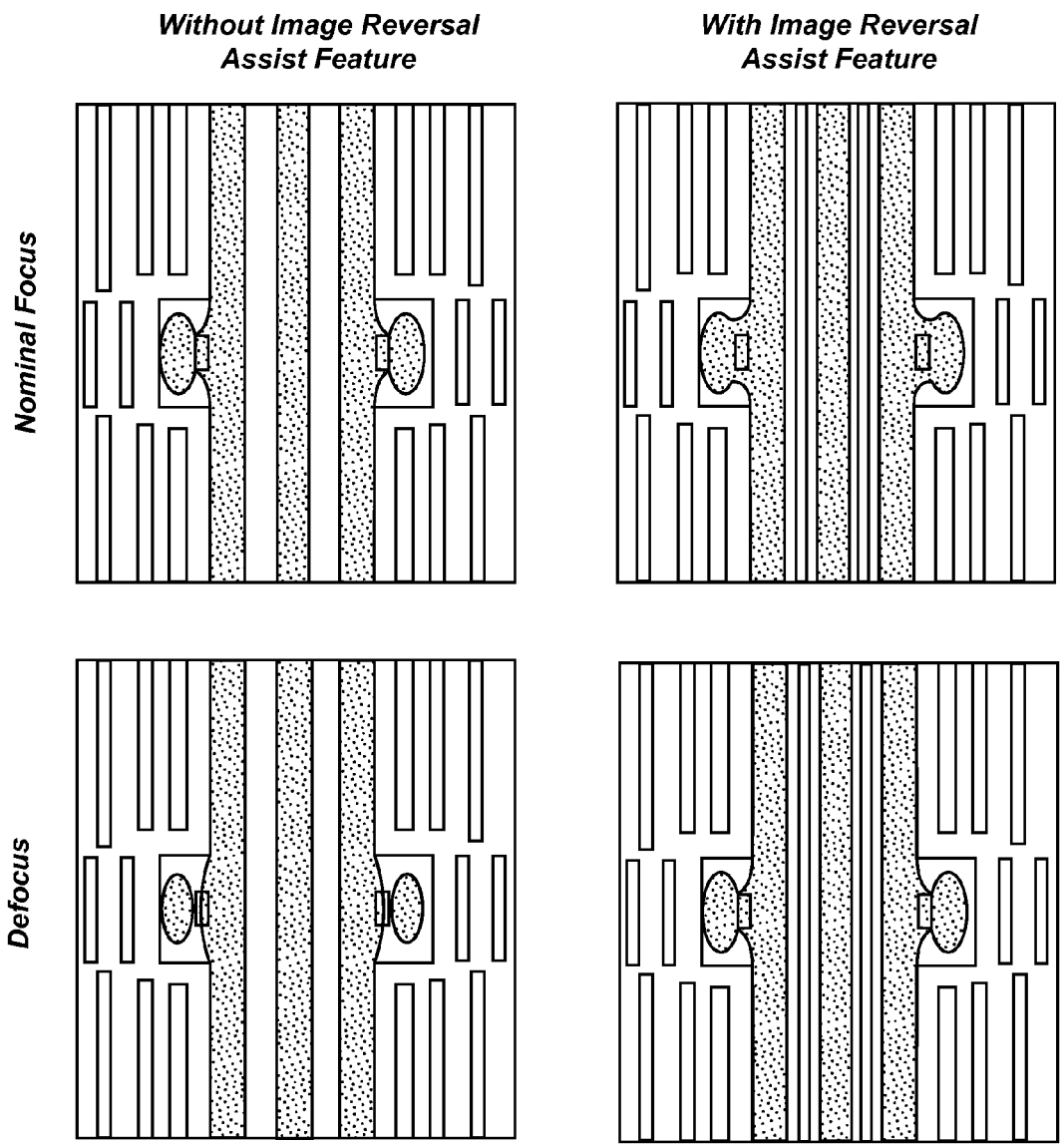
FIG. 6A illustrates two-dimensional areas that may be resolved on a semiconductor structure being processed in a microlithography process using a mask similar to that of FIG. 5, but without any image reversal assist features, at nominal focus conditions and at defocused conditions (the mask being overlaid over the resolved two-dimensional areas to facilitate illustration).
FIG. 6B illustrates two-dimensional areas that may be resolved on a semiconductor structure being processed in a microlithography process using the mask of FIG. 5, which includes image reversal assist features, at nominal focus conditions and at defocused conditions (the mask being overlaid over the resolved two-dimensional areas to facilitate illustration).

FIGS. 6A and 6B are used to illustrate how use of masks having image reversal assist features 76 may improve the depth of focus relative to processes in which similar masks not including such image reversal assist features 76 are employed.

FIG. 6A illustrates the results of computer simulations conducted using a computer model of a portion of a mask similar to the mask 60 of FIG. 5 and including a group 72 of three primary features 70A through 70C and standard assist features 74 to the lateral sides of the group 72, but that does not include image reversal assist feature 76 between the primary features 70A through 70C. FIG. 6A includes two aerial images, one of which illustrates the calculated areas (the stippled areas in FIG. 6A) that would be patterned in photoresist material 24 at a surface of a workpiece 22 being processed in a microlithography process using the portion of the mask of FIG. 6A (which does not include image reversal assist features 76) at nominal focus conditions, the other of which illustrates the calculated areas (the stippled areas in FIG. 6A) that would be patterned in photoresist material 24 at a surface of a workpiece 22 being processed in a microlithography process using the portion of the mask of FIG. 6A at defocused conditions. As shown in the aerial image of FIG. 6A corresponding to the defocus conditions, there is insufficient definition of the contact pad areas to be patterned by the contact pad areas 78 of the primary features 70A and 70C of the mask 60. Thus, contact pad areas formed may not be continuous with, and, hence, may not be conductively coupled to the lines of primary features to be patterned by the primary features 70A and 70C. As a result, the conductive pad areas may be defective and unsuitable for use if patterned under such defocus conditions.

FIG. 6B illustrates the results of computer simulations conducted using a computer model of a portion of the mask 60 of FIG. 5 including the group 72 of three primary features 70A through 70C, the standard assist features 74 to the lateral sides of the primary features 70A through 70C, and the image reversal assist features 76 between the primary features 70A through 70C. FIG. 6B also includes two aerial images, one of which illustrates the calculated areas (the stippled areas in FIG. 6B) that would be patterned in photoresist material 24 at a surface of a workpiece 22 being processed in a microlithography process using the portion of the mask 60 of FIG. 6B (which does include image reversal assist features 76) at nominal focus conditions, and the other of which illustrates the calculated areas (the stippled areas in FIG. 6B) that would be patterned in photoresist material 24 at a surface of a workpiece 22 being processed in a microlithography process using the portion of the mask 60 of FIG. 6B (which does include image reversal assist features 76) at the same defocus conditions used in the defocus simulations associated with FIG. 6A. As shown in the aerial image of FIG. 6B corresponding to the defocus conditions, there is sufficient definition of the contact pad areas to be patterned by the contact pad areas 78 of the primary features 70A and 70C of the mask 60 at the same defocus conditions associated with the defocus conditions of FIG. 6A to result in the formation of acceptable contact pad areas.

Thus, by employing the image reversal assist features 76 in the mask 60, the depth of focus may be improved relative to processes in which similar masks not including such image reversal assist features 76 are employed.

As described hereinabove with reference to FIGS. 3A through 3D, in accordance with some embodiments of the invention, a single image reversal assist feature may be provided at, or at least proximate, one or more locations on a microlithography mask between primary features that corresponds to a locations at which the phase of the electrical field present at the surface of the workpiece 22 being processed using the mask transitions between a "0" phase value and a "π" phase value. In accordance with additional embodiments of the invention, two or more image reversal assist features may be provided on a microlithography mask between primary features, and the two or more image reversal assist features may be centered about a location at, or at least proximate, a location that corresponds to a location at the surface of the workpiece 22 being processed using the mask at which the phase of the electrical field present at the surface transitions between a "0" phase value and a "π" phase value.

Figure 7:
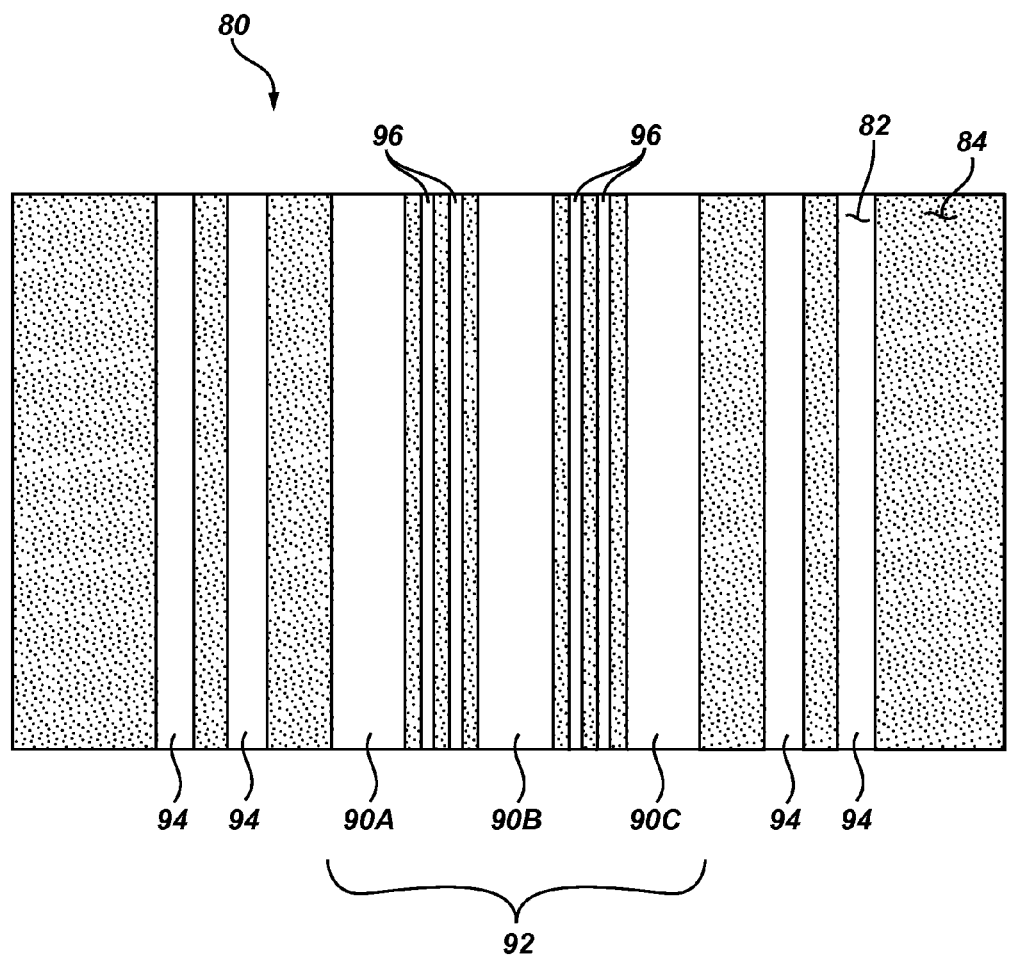
FIG. 7 is a simplified plan view illustration of a portion of another embodiment of a microlithography mask of the invention that includes image reversal assist features.

For example, FIG. 7 is a simplified plan view illustration of a portion of another embodiment of a microlithography mask 80 of the invention that includes image reversal assist features 96. The mask 80 is generally similar to the mask 40 of FIGS. 2A and 2B and includes substantially transparent substrate 82 and relatively non-transparent material 84 on selected areas of the substrate 82, thus defining a plurality of light features (illustrated as clear areas in FIG. 7) and dark features (illustrated as stippled areas in FIG. 7) on the mask 80. The mask 80 includes a group 92 of primary features 90A through 90C, as well as standard assist features 94, which may be at least substantially similar to the group 72A of primary features 70A through 70C and the standard assist features 54, respectively, of the mask 40 of FIGS. 2A and 2B.

The mask 80, however, includes a first pair of image reversal assist features 96 between first primary feature 70A and the second primary feature 70B, and a second pair of image reversal assist features 96 between the second primary feature 70B and the third primary feature 70C. The pairs of image reversal assist features 96 are located other than at resonant or anti-resonant locations relative to the primary features 90A through 90C. In particular, each pair of image reversal assist features 96 may be located between two of the primary features 90A through 90C, as shown in FIG. 7. Each pair of image reversal assist features 96 may be centered about a location at, or at least proximate to, a location that corresponds to a location at the surface of the workpiece 22 being processed using the mask 80 at which the phase of the electrical field present at the surface transitions between a "0" phase value and a "π" phase value (as shown in FIG. 3D). In additional embodiments, a group of three, four, or more image reversal assist features 96 may be centered about a location at, or at least proximate to, one or more such locations on the mask 80.

The image reversal assist features 96, like the standard assist features 94, may comprise light features, each of which includes a line having a shape and configuration similar to that of a line of the primary features 90A through 90C, but having a smaller width that is below the resolution limit of features on the mask 80. Due at least partially to their location, however, the pairs of image reversal assist features 96 may serve as dark field assist features, instead of as light field assist features, as do the standard assist features 94. In other words, the image reversal assist features 96 may serve to decrease undesirable exposure to imaging radiation in the regions of photoresist material 24 between those corresponding to the primary features to be patterned in the photoresist material 24 on a workpiece 22 being processed using the mask 80. Thus, in this manner, the image reversal assist features 96 further assist in improving the definition of the primary features to be patterned in a photoresist material 24 on a workpiece 22 being processed using the mask 80, but may not themselves be used to directly pattern a photoresist material 24 on a workpiece 22 being processed using the mask 80.

The image reversal assist features 96 may serve to enhance the depth of focus of the mask 80 in a similar manner to that provided by the image reversal assist features 56 of the mask 40 of FIGS. 2A and 2B and the image reversal assist features 76 of the mask 60 of FIG. 5, as discussed above.

Additional embodiments of the invention include methods of forming microlithography masks as described herein, such as, for example, the mask 40 of FIGS. 2A and 2B, the mask 60 of FIG. 5, and the mask 80 of FIG. 7. As discussed in further detail below, a relatively non-transparent material on a mask substrate may be patterned to form at least one image reversal assist feature, which may be disposed between at least two primary features.

Figure 8:
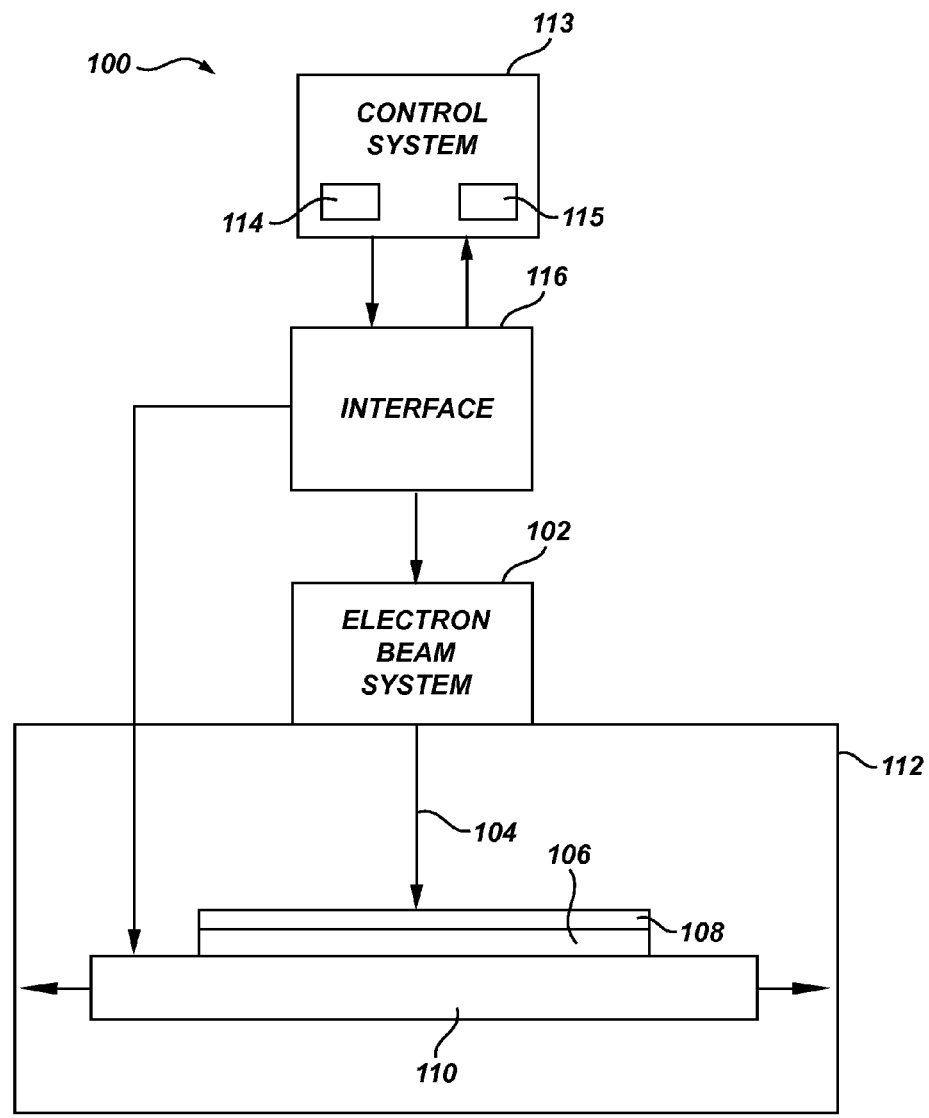
FIG. 8 is a simplified illustration of a portion of another embodiment of a microlithography mask of the invention that includes image reversal assist features.

FIG. 8 is a diagrammatic block view of a mask exposure system 100 that may be used to form microlithography masks as described herein. The mask exposure system 100 may be used to fabricate a microlithography mask that includes image reversal assist features, as described herein. As an example, a mask blank 106 may be provided that includes one or more surface coatings 108 thereon. For example, the surface coatings 108 may include a layer of relatively non-transparent material (e.g., opaque) that ultimately may form dark field regions of the mask to be formed from the blank. The layer of relatively non-transparent material may be selectively patterned to form a microlithography mask as described herein. As discussed above, the relatively non-transparent material may comprise a phase shift material, such that patterning the relatively non-transparent material comprises patterning a phase shift material on the mask substrate.

To pattern the layer of relatively non-transparent material, a patterned mask layer may be formed over the relatively non-transparent material on the mask substrate, and regions of the relatively non-transparent material exposed through the patterned mask layer may be etched. The layer of relatively non-transparent material may be wet or dry etched through apertures of the patterned mask layer to form the selected pattern in the relatively non-transparent material. Such a mask layer may be formed using a resist material. A resist material may be deposited over the relatively non-transparent material. Selected regions of the resist material may be exposed to energy to alter a property of the resist material in the selected regions. The resist material then may be developed to remove one of exposed and unexposed regions of the resist material. Thus, the surface coatings 108 shown in FIG. 8 also may include a layer of resist material disposed over the layer of semi-transparent or non-transparent material.

Since the microlithography masks disclosed herein (and to be formed using the mask exposure system 100) include assist features that are of such small size that they may not be resolved using standard photolithography systems that employ electromagnetic radiation to selectively expose a photoresist material, other types of lithography systems having lower resolution limits may be employed to expose a resist material and pattern a mask layer. For example, the mask exposure system 100 may comprise an electron beam lithography system.

Thus, the mask exposure system 100 may include an electron beam system 102 that projects an electron beam 104 towards a microlithography mask blank 106, which may have at least one surface coating 108 thereon. As discussed above, the surface coating 108 may comprise an electron-beam resist material. Although not shown in FIG. 8, the electron beam system 102 may also include a beam source (such as a thermionic source or a cold cathode source), a blanker that is configured to interrupt the beam source, a magnetic beam deflection system, and/or an electrostatic deflection system that is configured to steer the electron beam 104 across a selected portion of the surface of the mask blank 106. Since the magnetic beam deflection system and/or the electrostatic deflection system may be unable to steer the electron beam 104 to all locations on the surface of the mask blank 106, the mask blank 106 may be positioned upon a stage 110 that may be translated in one or more of several (e.g., three) mutually-orthogonal directions. The system 100 may also include a vacuum chamber 112 that substantially encloses the mask blank 106 and the stage 110, so that the electron beam 104 may be directed from the electron beam system 102 to the mask blank 106 under vacuum.

The system 100 also includes a control system 113, which may include a computer device comprising memory 114 and a processor 115. A computer program may reside in the memory 114 of the control system 113. A model of a mask to be fabricated using the mask exposure system 100 also may be stored in the memory 114 of the control system 113, and the computer program may be configured to control the various active components of the mask exposure system 100 to cause the mask exposure system 100 to form a mask from the mask blank 106. As non-limiting examples, the control system 113 may include various known devices such as a mainframe computer device, desktop computer device, a portable or "laptop" computer device, a programmable logic controller, or a custom built computer device.

Still referring to FIG. 8, the mask exposure system 100 may include an interface 116 coupled to the control system 113 and configured to receive instructions from the control system 113. The interface 116 may be configured to translate instructions received from the control system 113 and convert the received instructions into signals that may be used to control the active components of the mask exposure system 100, such as, for example, the electron beam system 102 and the stage 110. Accordingly, the control system 113 and the interface 116 may cooperatively control scanning of the electron beam 104 across the surface of the imaging mask blank 106. Suitable scanning methods may include raster-scanning and vector scanning the electron beam 104 over the mask blank 106.

After exposing selected regions of the photoresist material to the electron beam 104, the photoresist material may be developed to form a patterned mask layer. An etching apparatus (not shown in FIG. 8) then may be used to selectively etch (wet or dry) the layer of semi-transparent or non-transparent material to selectively pattern the semi-transparent or non-transparent material and form a microlithography mask as described herein.

Thus, in some embodiments, the invention includes microlithography masks that include a substrate and a patterned non-transparent or semi-transparent material on the substrate. The non-transparent or semi-transparent material defines a plurality of features of the mask that include at least one image reversal assist feature disposed between at least two primary features.

In additional embodiments, the invention includes microlithography systems that include such masks. For example, a microlithography system may include a stage for supporting a workpiece to be processed using the microlithography system, an illumination system for emitting electromagnetic radiation, a mask located and configured for selectively patterning electromagnetic radiation emitted by the illumination system, and a projection lens assembly for projecting electromagnetic radiation emitted by the illumination system and patterned by the mask onto a workpiece to be supported by the stage. The mask may include at least one image reversal assist feature disposed between at least two primary features.

In yet further embodiments, the invention includes methods of forming microlithography masks that include patterning a non-transparent or semi-transparent material on a mask substrate, and forming at least one image reversal assist feature disposed between at least two primary features.

While the present invention has been described in terms of certain illustrated embodiments and variations thereof, it will be understood and appreciated by those of ordinary skill in the art that embodiments of the invention are not so limited. Rather, additions, deletions and modifications to the illustrated embodiments may be effected without departing from the scope of the invention as defined by the claims that follow, and their legal equivalents. Furthermore, elements and features of one embodiment described herein may be implemented into, or combined with, any other embodiment described herein without departing from the scope of the invention.

What is claimed is:

1. A microlithography mask, comprising:
 a substantially transparent material; and
 a patterned, relatively non-transparent material over the substantially transparent material, the relatively non-transparent material defining a plurality of features of the microlithography mask, the plurality of features comprising:
  at least two primary features; and
  at least one image reversal assist feature between the at least two primary features.

2. The microlithography mask of claim 1, wherein the substantially transparent material comprises one or more of quartz glass, soda-lime glass, borosilicate glass, and borophosphosilicate glass.

3. The microlithography mask of claim 1, wherein the relatively non-transparent material comprises a phase shifting material.

4. The microlithography mask of claim 1, wherein the relatively non-transparent material comprises at least one of a metal, a metal alloy, and/or molybdenum silicide.

5. The microlithography mask of claim 1, wherein the at least two primary features comprise apertures through the relatively non-transparent material.

6. The microlithography mask of claim 1, wherein the at least one image reversal assist feature is located on the microlithography mask at least proximate a location corresponding to a location at a surface of a workpiece to be processed using the mask at which a phase of an electrical field present at the surface transitions between phases.

7. The microlithography mask of claim 1, wherein the at least one image reversal assist feature comprises a plurality of image reversal assist features, the plurality of image reversal assist features centered about a location on the microlithography mask at least proximate to a location corresponding to a location at a surface of a workpiece to be processed using the mask at which a phase of an electrical field present at the surface transitions between phases.

8. The microlithography mask of claim 1, wherein each of the at least two primary features has an average width of less than about four hundred nanometers (400 nm) on the microlithography mask, and wherein the at least one image reversal assist feature has an average width between about 10% and about 70% of the average width of each of the at least two primary features.

9. The microlithography mask of claim 8, wherein the at least one image reversal assist feature has an average width of about 25% of the average width of each of the at least two primary features.

10. The microlithography mask of claim 8, wherein the at least two primary features are separated by an average distance of between about 90% and about 110% of the average width of each of the at least two primary features.

11. The microlithography mask of claim 8, further comprising at least one standard assist feature located proximate at least one primary feature of the at least two primary features.

12. A microlithography system, comprising:
   an illumination system configured to emit electromagnetic radiation;
   a mask comprising at least one image reversal assist feature between at least two primary features, the mask configured to selectively transmit electromagnetic radiation emitted by the illumination system; and
   a projection lens assembly configured to project electromagnetic radiation emitted by the illumination system and transmitted by the mask onto a workpiece.

13. The microlithography system of claim 12, wherein the illumination system is configured to emit at least substantially monochromatic radiation having a wavelength at one of 193 nanometers, 248 nanometers, and 308 nanometers.

14. The microlithography system of claim 12, wherein the illumination system comprises an argon-fluoride laser configured to emit radiation at a 193 nm wavelength.

15. The microlithography system of claim 12, wherein the mask comprises an attenuated phase shifting mask.

16. The microlithography system of claim 15, wherein the attenuated phase shifting mask comprises a molybdenum silicide material.

17. The microlithography system of claim 12, wherein the at least one image reversal assist feature is located on the mask at least proximate a location corresponding to a location at a surface of a workpiece to be processed using the mask at which a phase of an electrical field present at the surface transitions between a 0 phase and a π phase.

18. The microlithography system of claim 12, wherein the at least one image reversal assist feature comprises a plurality of image reversal assist features, the plurality of image reversal assist features centered about a location on the mask at least proximate to a location corresponding to a location at a surface of a workpiece to be processed using the mask at which a phase of an electrical field present at the surface transitions between phases.

19. The microlithography system of claim 12, wherein each of the at least two primary features has an average width of less than about four hundred nanometers (400 nm) on the mask, and wherein the at least one image reversal assist feature has an average width between about 10% and about 70% of the average width of each of the at least two primary features.

20. A method of forming a microlithography mask, comprising patterning a relatively non-transparent material on a substantially transparent material, wherein the patterning comprises forming at least one image reversal assist feature disposed between at least two primary features.

21. The method of claim 20, wherein patterning a relatively non-transparent material on a substantially transparent material comprises patterning a phase shift material on a mask substrate.

22. The method of claim 20, wherein patterning a relatively non-transparent material comprises:
   forming a patterned mask layer over the relatively non-transparent material; and
   etching regions of the relatively non-transparent material exposed through the patterned mask layer.

23. The method of claim 22, wherein forming a patterned mask layer comprises:
   depositing a resist material over the relatively non-transparent material;
   exposing selected regions of the resist material to energy to alter a property of the resist material in the selected regions; and
   developing the resist material to remove one of exposed and unexposed regions of the resist material.

24. The method of claim 23, wherein exposing selected regions of the resist material to energy comprises exposing selected regions of the resist material to an electron beam.

25. The method of claim 20, wherein forming at least one image reversal assist feature comprises locating the at least one image reversal assist feature on the mask at least proximate to a location corresponding to a location at a surface of a workpiece to be processed using the mask at which a phase of an electrical field present at the surface transitions between phases.

26. The method of claim 20, wherein forming at least one image reversal assist feature comprises:
   forming a plurality of image reversal assist features; and
   centering the plurality of image reversal assist features about a location on the mask at least proximate to a location corresponding to a location at a surface of a workpiece to be processed using the mask at which a phase of an electrical field present at the surface transitions between phases.

27. The method of claim 20, further comprising forming the at least two primary features to have an average width of less than about four hundred nanometers (400 nm) on the mask, and forming the at least one image reversal assist feature to have an average width between about 10% and about 70% of the average width of each of the at least two primary features.

* * * * *